(12) United States Patent
Huang et al.

(10) Patent No.: US 8,513,747 B1
(45) Date of Patent: Aug. 20, 2013

(54) INTEGRATED MEMS DEVICES WITH CONTROLLED PRESSURE ENVIRONMENTS BY MEANS OF ENCLOSED VOLUMES

(71) Applicant: InvenSense, Inc., Sunnyvale, CA (US)

(72) Inventors: Kegang Huang, Fremont, CA (US); Martin Lim, San Mateo, CA (US); Steven S. Nasiri, Saratoga, CA (US)

(73) Assignee: Invensense, Inc., Sunnyvale, CA (US)

( * ) Notice: Subject to any disclaimer, the term of this patent is extended or adjusted under 35 U.S.C. 154(b) by 0 days.

(21) Appl. No.: 13/711,070

(22) Filed: Dec. 11, 2012

Related U.S. Application Data

(62) Division of application No. 13/541,306, filed on Jul. 3, 2012, now Pat. No. 8,350,346.

(51) Int. Cl.
*H01L 29/84* (2006.01)
(52) U.S. Cl.
USPC ............ 257/415; 257/414; 257/417; 257/420

(58) Field of Classification Search
USPC ............. 257/414–420, 787–790; 438/48–52, 438/455–459
See application file for complete search history.

(56) References Cited

U.S. PATENT DOCUMENTS

| | | | |
|---|---|---|---|
| 5,285,131 A | 2/1994 | Muller et al. | |
| 5,493,177 A | 2/1996 | Muller et al. | |
| 5,531,121 A | 7/1996 | Sparks et al. | |
| 6,936,491 B2 | 8/2005 | Partridge et al. | |
| 7,008,812 B1 | 3/2006 | Carley | |
| 7,075,160 B2 | 7/2006 | Partridge et al. | |
| 2009/0294879 A1* | 12/2009 | Bhagavat et al. | 257/415 |
| 2012/0043627 A1* | 2/2012 | Lin et al. | 257/415 |

* cited by examiner

*Primary Examiner* — Dung A. Le
(74) *Attorney, Agent, or Firm* — Sawyer Law Group, P.C.

(57) ABSTRACT

An integrated MEMS device comprises a wafer where the wafer contains two or more cavities of different depths. The MEMS device includes one movable structure within a first cavity of a first depth and a second movable structure within a second cavity of a second depth. The cavities are sealed to maintain different pressures for the different movable structures for optimal operation. MEMS stops can be formed in the same multiple cavity depth processing flow. The MEMS device can be integrated with a CMOS wafer.

14 Claims, 6 Drawing Sheets

INTEGRATED MEMS DEVICES WITH CONTROLLED PRESSURE ENVIRONMENTS BY MEANS OF ENCLOSED VOLUMES

CROSS-REFERENCE TO RELATED APPLICATION

Under 35 U.S.C. 120, this application is a Divisional Application and claims priority to U.S. patent application Ser. No. 13/541,306, filed on Jul. 3, 2012, entitled "INTEGRATED MEMS DEVICES WITH CONTROLLED PRESSURE ENVIRONMENTS BY MEANS OF ENCLOSED VOLUMES", which is related to U.S. patent application Ser. No. 13/535,180, filed on Jun. 27, 2012, entitled "METHODS FOR CMOS-MEMS INTEGRATED DEVICES WITH MULTIPLE SEALED CAVITIES MAINTAINED AT VARIOUS PRESSURES", which claims benefit to U.S. Provisional Patent Application No. 61/501,652, filed on Jun. 27, 2011, entitled "MEMS DEVICES, INTEGRATED MEMS-CMOS,".

FIELD OF THE INVENTION

The present invention relates generally to MEMS devices and more specifically to integrated MEMS devices with multiple sealed cavities.

BACKGROUND OF THE INVENTION

When integrating multiple MEMS devices on a single chip, it is often desirable to have the different devices sealed at different pressures as the performance of each device may be dependent on the operating pressure. Accordingly systems and methods are provided for MEMS devices where MEMS structures are sealed at different pressures and integrated with CMOS devices.

SUMMARY OF THE INVENTION

An integrated MEMS device is disclosed. The integrated MEMS device comprises two or more cavities of different depths. The MEMS device includes one movable structure within a first cavity of a first depth and a second movable structure within a second cavity of a second depth. The cavity depths provide a means to adjust the volumes of the enclosures for each of the movable structures. The enclosed volumes have associated pressures enabling each movable structure to operate at its own optimal pressure.

BRIEF DESCRIPTION OF THE DRAWINGS

FIG. 1b illustrates an embodiment of a schematic top view of the handle wafer of FIG. 1a.

FIG. 2b illustrates an embodiment of a schematic top view of the handle wafer of FIG. 2a.

DETAILED DESCRIPTION

The present invention relates generally to MEMS devices and more specifically to integrated CMOS-MEMS devices or silicon capped MEMS devices. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiments shown, but is to be accorded the widest scope consistent with the principles and features described herein.

Multiple Cavity Depths to Control Volume and Thus Pressure

Figure 1A:
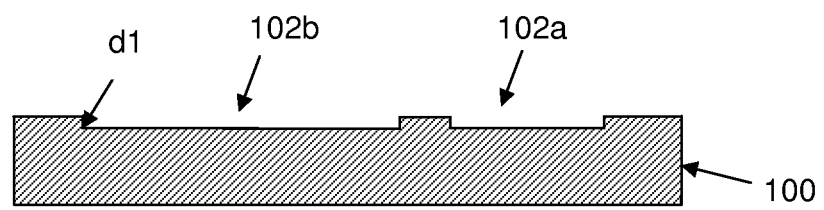
FIG. 1a illustrates an embodiment of a schematic side view of an example handle or starting silicon wafer with two shallow cavities.
Figure 1B:
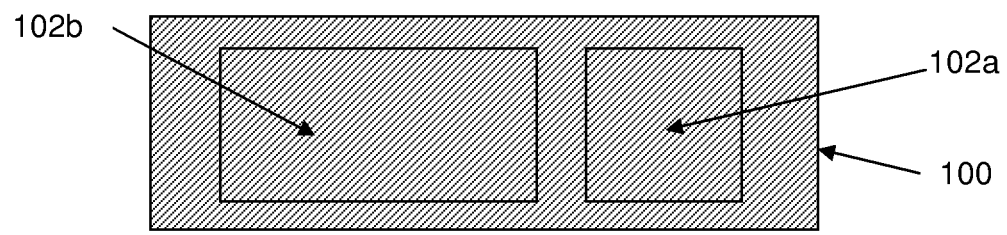

In an embodiment, a MEMS engineered silicon on insulator (ESOI) wafer with multiple cavities of different depths is bonded (at a given chamber pressure) to a standard CMOS wafer. In an embodiment, the MEMS device can be an inertial gyroscope or rate of rotation sensor. In another embodiment, the MEMS device can be an inertial acceleration sensor. FIGS. 1a and 1b illustrate a schematic side view and top view of a handle or silicon wafer structure respectively. The handle wafer 100, in an embodiment, has been patterned and etched to provide two shallow cavities 102a and 102b with a depth of d1 (for example, 2 to 10 um deep) in certain areas.

Figure 2A:
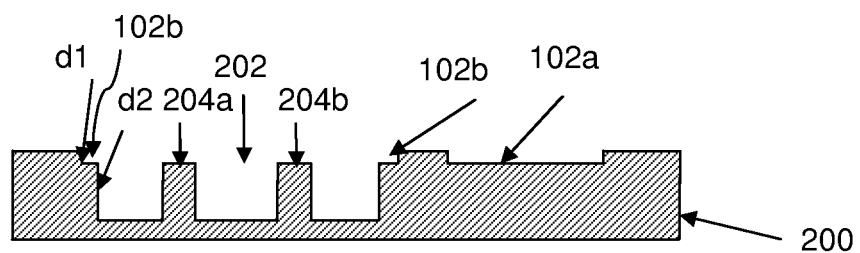
FIG. 2a illustrates an embodiment of a schematic side view of an example handle wafer with a deep cavity formed in one of the two shallow cavities.
Figure 2B:
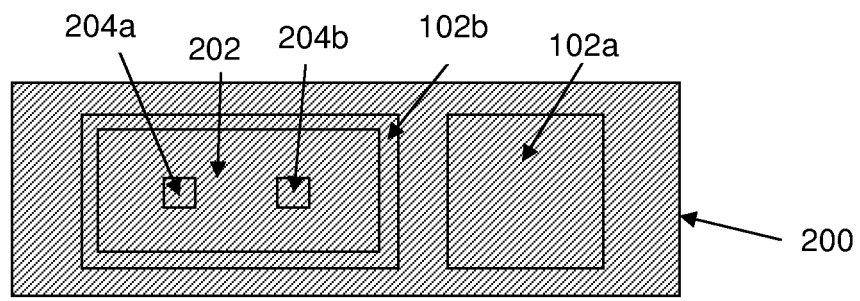

FIG. 2a illustrates a schematic side view of the handle wafer 200 after a second deeper cavity 202 has been provided thereon. In this embodiment, the handle wafer 100 in FIG. 1a-1b has been patterned again to etch a deeper cavity 202 with a depth of d2 (for example 15 to 100 um deep), within the same die and within one of the two shallow cavity areas (102b in this case) resulting in a larger volume. Cavity 202 includes MEMS stops 204a and 204b. The MEMS stops 204a and 204b are vertical structures within the cavity 202 to limit the travel of a movable structure (described in conjunction with FIG. 5) that is located over the deep cavity. The bottom surface of cavity 102a is used to limit the travel of a moveable structure that is located over the shallow cavity (described in conjunction with FIG. 5). The amount of motion allowed is determined by the depth of the shallow cavities 102a and 102b. The pattern definition of the deeper cavity 202 may require enhancements to standard photolithography including the use of a thicker photoresist to planarize the shallow cavities 102a and 102b or the application of photoresist using a spray coating technique. These techniques are not standard but are commonly practiced. Good lithographic resolution of cavity 202 is required to define the MEMS stops 204a and 204b (approximately 5×5 um) in the 102b region. FIG. 2b illustrates a schematic top view of the structure shown in FIG. 2a.

Figure 3:
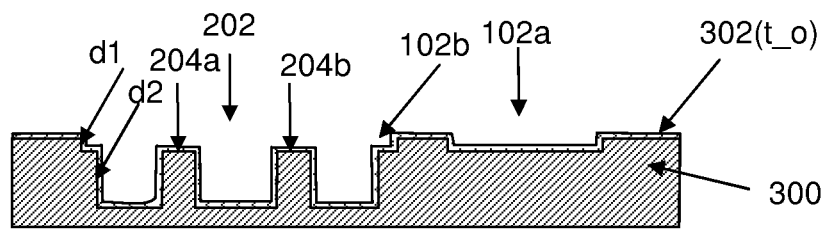
FIG. 3 illustrates an embodiment of a schematic side view of the handle wafer with two cavities of different depths with a silicon oxide thin layer on top.

FIG. 3 illustrates the side view of a handle wafer with cavities of different depths. In an embodiment, a thin conformal layer of silicon oxide 302 with a thickness of t_o is deposited or grown on handle wafer 200 to form the handle wafer 300. In an embodiment, the oxidation layer 302 is provided through a deposition or thermal oxidation process.

Figure 4:
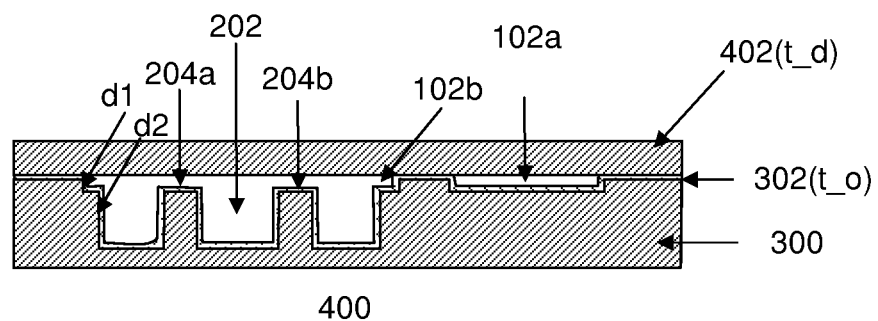
FIG. 4 illustrates an embodiment of a schematic side view of the engineered SOI wafer where a device silicon wafer has been bonded to the handle wafer and subsequently thinned.

FIG. 4 illustrates an embodiment of a schematic side view of the engineered SOI wafer 400 comprising the handle wafer 300 and device silicon layer 402. Device silicon layer 402 is provided over the handle wafer 300 by bonding a second wafer to the handle wafer 300 and thinning the second wafer to a desired device layer thickness (t_d). In an embodiment, the bonding can be silicon direct bonding or fusion-bonding.

Figure 5:
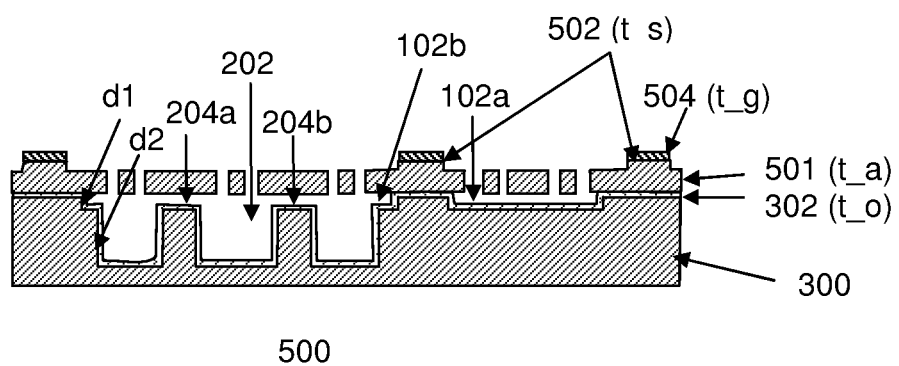
FIG. 5 illustrates an embodiment of a side view of a completed MEMS wafer, ready to be bonded to CMOS wafer.

FIG. 5 illustrates a side view of a completed MEMS wafer 500, ready for bonding to a CMOS wafer. Device layer 402 is patterned and etched to form stand-offs 502 (STDOFF with typical thickness t_s of 1 to 5 um). A film of germanium (Ge) 504 of thickness t_g is deposited onto device layer after stand-offs 502 are formed and subsequently patterned and etched to leave the Ge film 504 on top of stand-offs 502. The MEMS wafer 500 is completed after a silicon structure is patterned and etched.

Figure 6A:
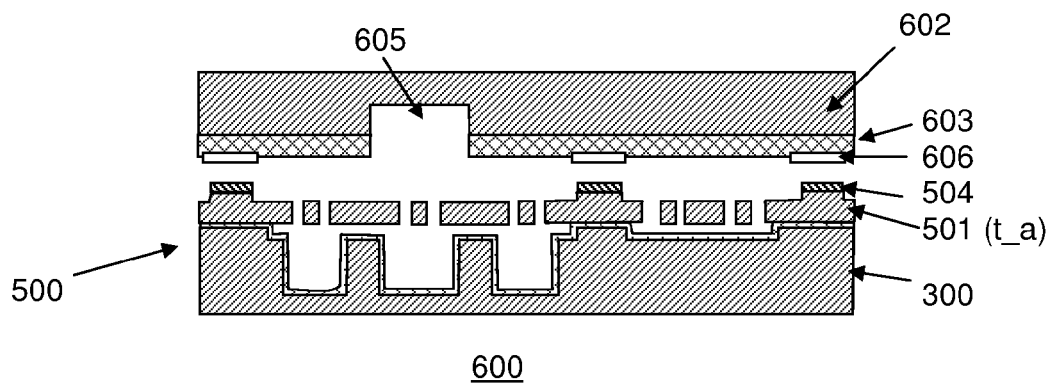
FIG. 6a illustrates an embodiment of a schematic side view of a completed MEMS wafer (bottom) and a completed CMOS wafer (top) before bonding at a given chamber pressure.

FIGS. 6a-6c, 7a-7b, and 8a-8b depict various wafer level encapsulation embodiments that utilize at least one silicon wafer containing at least two cavity depths. FIG. 6a illustrates MEMS integration or packaging embodiment 600 where a CMOS wafer 602 with a cavity 605 will be assembled on to the MEMS wafer 500. The CMOS wafer 602 is placed in proximity to MEMS wafer 500 in a vacuum bond chamber (not shown) for wafer bonding at a given pressure. The bonding process comprises wafer alignment, heating, and evacuation of the bond chamber. The wafers are then brought into contact at a temperature sufficient to mechanically bond aluminum 606 to germanium 504. In an embodiment, the bond can be an eutectic bond. The aluminum 606 is typically the top metal layer of a multi-metal CMOS with inter-metal dielectric system 603. In an embodiment, a CMOS cavity 605 can be etched in advance to further increase the volume of the large-volume cavity, leading to lower pressure after wafer bonding.

Figure 6B:
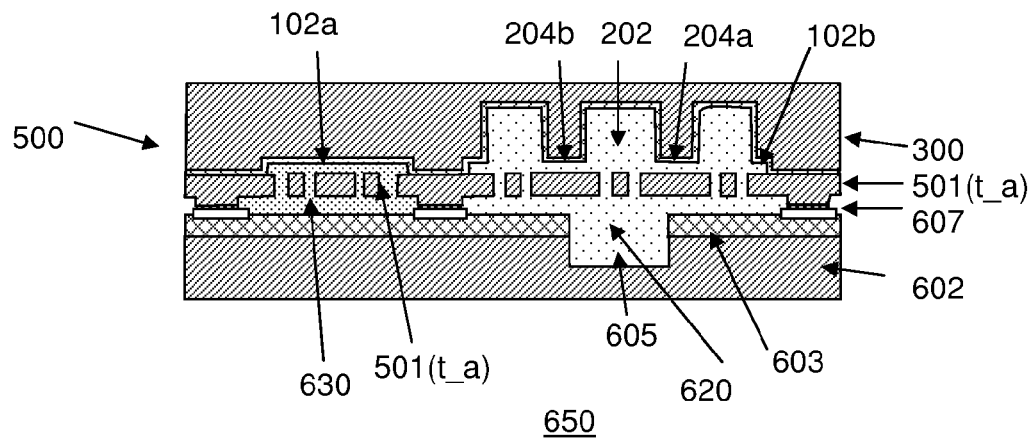
FIG. 6b illustrates an embodiment of the schematic side view of a CMOS-MEMS integrated wafer after a CMOS wafer is bonded to the MEMS wafer.

FIG. 6b illustrates an embodiment of a schematic side view 650 of an integrated CMOS wafer 602 and MEMS wafer 500, where the wafer is flipped up-side-down (with CMOS wafer 602 in the bottom for clarity) and bonded. In an embodiment, wafer bonding (Al—Ge eutectic bonding) 607 is employed to bond the aluminum 606 with germanium 504. However, other bonding techniques can be used for CMOS-MEMS wafer integration as well such as anodic bonding, glass frit bonding, or epoxy bonding. The hermetic bonding isolates the MEMS device in shallow cavity region (with smaller total enclosure volume) from MEMS device in the deep cavity region (with large total enclosure volume). The volume of the enclosure 620 comprises the deep cavity 202 with depth of d2, shallow cavity 102b with depth d1, volume due to stand-off height t_s, and cavity volume 605 in CMOS wafer 602. The pressure in larger-volume enclosure 620 is low (as indicated in a low-density dot-pattern). The volume of the enclosure 630 comprises only the shallow cavity 102a with depth d1 and volume due to stand-off height t_s. The pressure in smaller-volume enclosure 630 is high (as indicated in a high-density dot-pattern). In an embodiment, by adjusting the vertical and horizontal dimensions of the cavity, the volumes of each of the cavities that enclose the movable structures can be adjusted for optimal pressure and therefore optimal functionality. Due to the out-gassing mechanisms the final cavity pressure of the enclosed cavity 630 with shallow depth is higher than the pressure of the enclosed cavity 620 with the deeper depth. In addition, the top surface of shallow cavity 102a serves as MEMS stop in high pressure enclosure 630. The MEMS stops 204a and 204b in the deep cavity 202 of the handle wafer 300 serve as MEMS stops in low pressure enclosure 620.

Figure 6C:
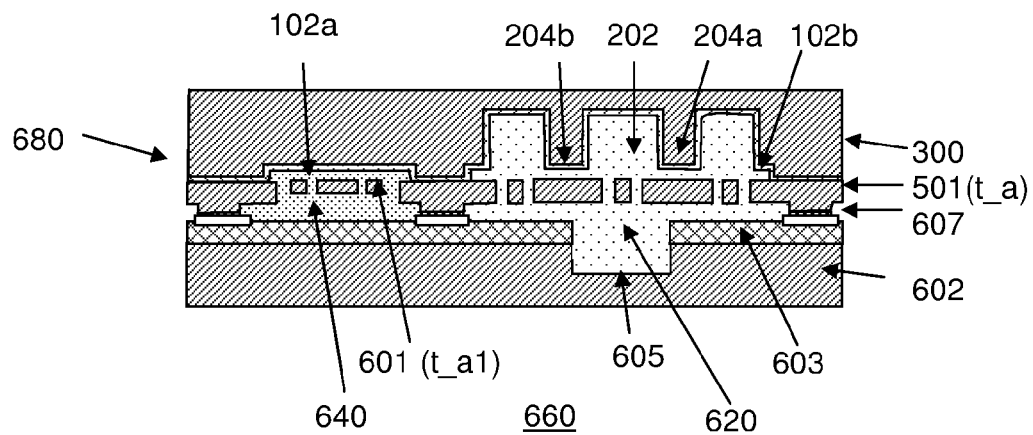
FIG. 6c illustrates an embodiment of the schematic side view of a CMOS-MEMS integrated wafer after a CMOS wafer is bonded to the MEMS wafer, where the MEMS Si structure in different sealed cavities have different thicknesses.

FIG. 6c illustrates an embodiment of a schematic side view 660 of an integrated CMOS wafer 602 and MEMS wafer 680, similar to the case of FIG. 6b. However, in this embodiment, the MEMS actuator 601 in shallow cavity enclosure 640 can be made to have a smaller actuator thickness (t_a1) as compared to the MEMS actuator 501 with a larger thickness t_a in the MEMS enclosure 620. The reduced thickness (t_a–t_a1) will effectively increase the corresponding enclosed volume of 640 than 630, and therefore will decrease the cavity pressure accordingly. This indicates that the MEMS actuator thickness can be used as a parameter to fine tune the pressure.

Figure 7A:
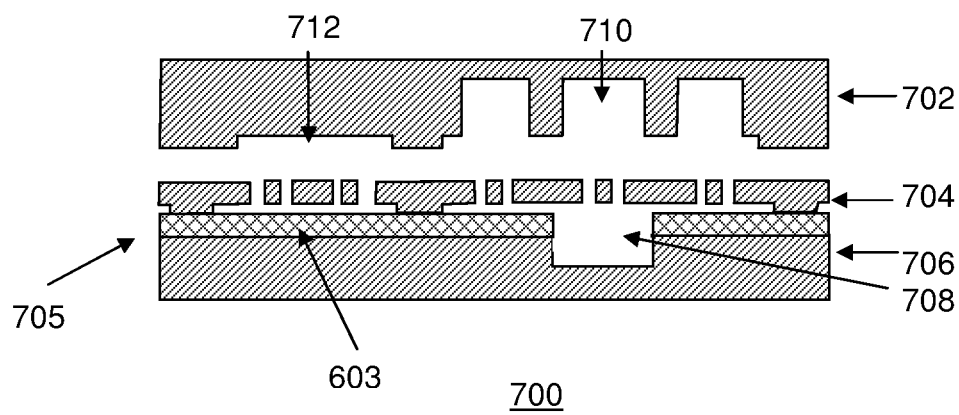
FIG. 7a illustrates an embodiment of the schematic side view of a silicon cap wafer (top) which includes a first shallow cavity and a second cavity of greater depth, and a surface MEMS structure built on a CMOS wafer (bottom), before packaging seal (or bonding) at a given pressure.
Figure 7B:
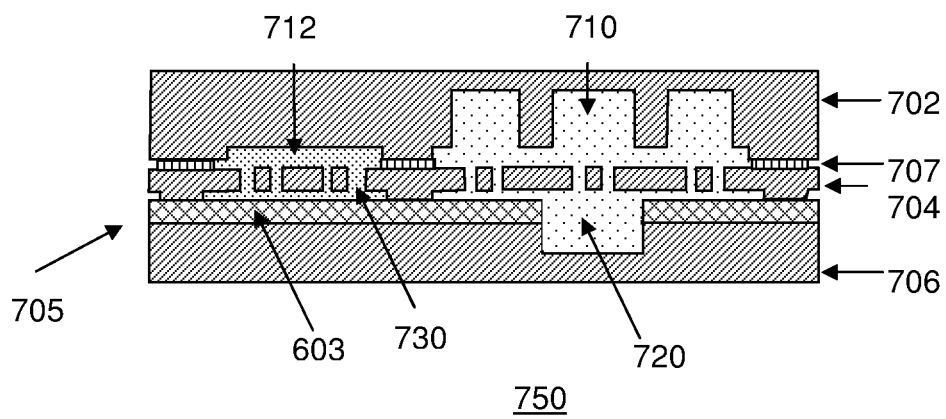
FIG. 7b illustrates an embodiment of a schematic side view of a capped (packaged, sealed or bonded) CMOS-MEMS wafer.

FIG. 7a illustrates another embodiment 700 of CMOS-MEMS integration where the dual cavity depths are implemented on a silicon cap wafer 702 for encapsulating MEMS structure. FIG. 7a also illustrates CMOS-MEMS wafer 705 where the MEMS structures 704 is disposed on to a CMOS substrate 706 by conventional surface micromachining techniques or the use of wafer bonding and thinning. In an embodiment, a silicon cap wafer 702 (with shallow cavity 712 and deep cavity 710) and a CMOS-MEMS wafer 705 (with a cavity 708) are integrated together with various bonding techniques as shown in FIG. 7b. In an embodiment 750 shown in FIG. 7b, bonding 707 can be eutectic bonding, anodic bonding, glass frit bonding, epoxy bonding or any other wafer bonding techniques. In an embodiment, by adjusting the vertical and horizontal dimensions of the cavity, the volumes of each of the cavities that enclose the movable structures can be adjusted for optimal pressure and therefore optimal functionality. Due to the out-gassing mechanisms the final pressure of the enclosure volume 730 with shallow cavity depth 712 is higher than that of the enclosed cavity 720 with the deeper depth 710.

Figure 8A:
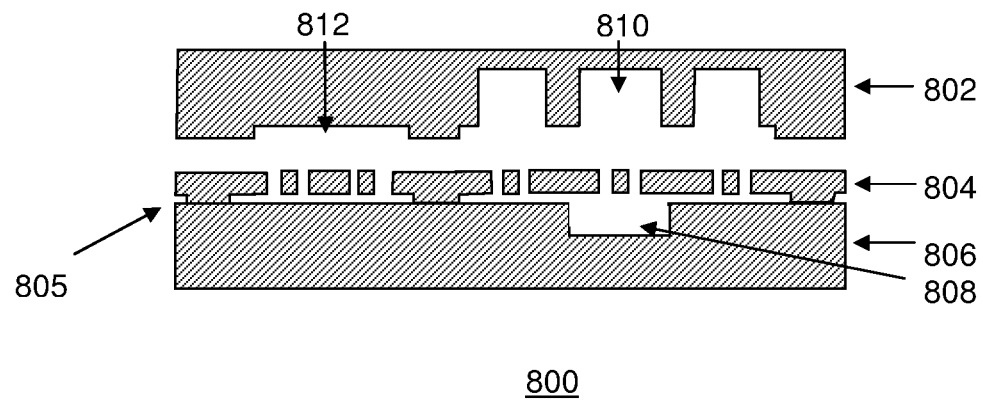
FIG. 8a illustrates an embodiment of a schematic side view of a silicon cap wafer (top) and a MEMS wafer with a silicon substrate (bottom), before bonding at a given pressure.
Figure 8B:
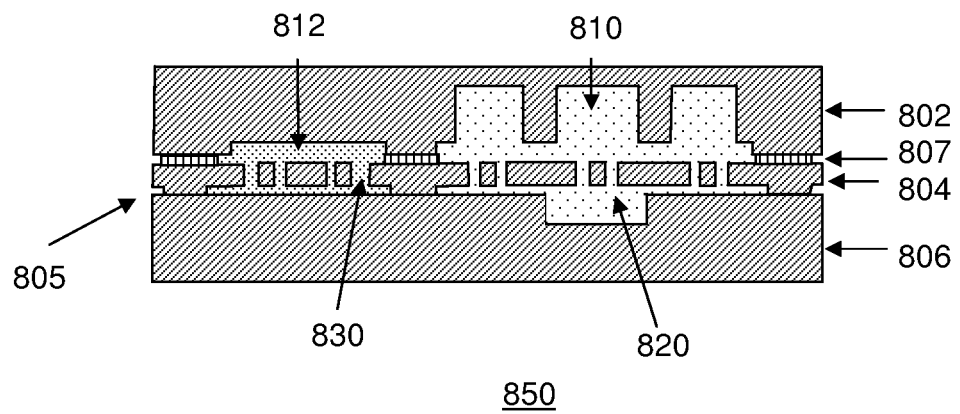
FIG. 8b illustrates an embodiment of a schematic side view of a silicon cap wafer (top) bonded to a MEMS wafer with a silicon substrate.

FIG. 8a illustrates another embodiment of MEMS integration 800 where the dual cavity depths are implemented on a silicon cap wafer 802 for MEMS encapsulation. FIG. 8a also illustrates MEMS wafer 805 where the MEMS structures 804 is disposed on to a silicon substrate 806 with a cavity 808 by conventional surface micromachining techniques or the use of wafer bonding and thinning. In an embodiment, silicon cap wafer 802 with shallow cavity 812 and deep cavity 810 and CMOS-MEMS wafer 805 with a cavity 808 are then integrated together with various bonding techniques as shown in FIG. 8b. In an embodiment 850, bonding 807 can be eutectic bonding, glass frit bonding, epoxy bonding or any other wafer bonding techniques. In an embodiment, by adjusting the vertical and horizontal dimensions of the cavity, the volumes of each of the cavities for the movable structures can be adjusted for optimal pressure and therefore optimal functionality. Due to the out-gassing mechanisms the final cavity pressure of the enclosed cavity 830 with shallow depth 812 is higher than that of the enclosed cavity 820 with the deeper depth 810.

In the packaging schemes described in FIGS. 6a-6c, 7a-7b, and 8a-8b, the enclosure pressures can be determined by means of enclosure volume, mainly by the cavity depth (d1 or d2 shown in FIG. 2a). Further, the fine-tuning of enclosure pressure can also be achieved by adjusting the following dimensions: actuator thicknesses (t_a or t_a1), silicon oxide film thickness (t_o), Ge film thickness (t_g), and stand-off height (t_s). The final pressure of the enclosure is also determined by the area of the cavities, including MEMS cavity, silicon cap wafer cavity, and CMOS cavity in the corresponding integrated or packaged MEMS device.

Advantages

A system and method in accordance with the present invention provides controlled multiple pressures using multiple cavities of different depth to provide different enclosure volumes. A system and method in accordance with the present invention also provides isolation of a device area in a single die for dual (multiple) locations for different cavity pressures by controlling cavity depth (therefore cavity volume). The final pressure of the enclosed cavity also depends on bonding pressure and post-bond out-gassing. A system and method in accordance with the present invention allows for a dual (or multiple) cavity depth processing flow in an engineered SOI or a silicon cap wafer. A system and method in accordance with the present invention creates MEMS stops in the dual cavity depth process flow to prevent MEMS breakage or cracking from an incidental shock. Finally, the height, the contact area, and location of the MEMS stops can be determined based on device requirements.

A system and method in accordance with the present invention provides a hermetically sealed MEMS device containing two or more independently sealed enclosures, each enclosure having an independent pressure. In addition, the system and method can provide needed mechanical stops for MEMS structures. This approach allows integration of two or more devices requiring different pressures (for example, integrating MEMS resonators and accelerometers, accelerometers and gyros or magnetic sensors, etc.).

Although the present invention has been described in accordance with the embodiments shown, one of ordinary skill in the art will readily recognize that there could be variations to the embodiments and those variations would be within the spirit and scope of the present invention. For example, although two MEMS stops are described in the embodiment of the present specification, one of ordinary skill in the art readily recognizes that one or more MEMS stops can be utilized in the deeper cavity to act as a MEMS stop and that would be within the spirit and scope of the present invention. Accordingly, many modifications may be made by one of ordinary skill in the art without departing from the spirit and scope of the appended claims.

The invention claimed is:

1. A MEMS device comprising:
   two or more enclosures of different volumes; at least one of the two or more enclosures comprising at least one cavity;
   a first structure within a first enclosure; and
   a second structure within a second enclosure,
wherein the volume of the first enclosure is different from the volume of the second enclosure, wherein a substrate defines part of the first and second sealed enclosures, wherein the substrate contains two or more etched cavities of different depths.

2. The device of claim 1, wherein the first enclosure comprises a cavity depth that is different than the cavity depth of the second enclosure.

3. The device of claim 2, wherein a bottom surface of one of the two enclosures acts as a MEMS stop.

4. The device of claim 3, wherein the MEMS stop is defined by a shallow cavity depth.

5. The MEMS device of claim 1, wherein a substrate defines part of the at least one cavity.

6. The MEMS device of claim 5, wherein the substrate is formed from a silicon wafer.

7. The device of claim 6, further comprising a CMOS wafer mechanically bonded to the silicon wafer.

8. The device of claim 7, wherein the mechanical bond is a eutectic bond.

9. The device of claim 8, wherein the eutectic bond is between aluminum on the CMOS wafer and germanium on the silicon wafer.

10. The MEMS device of claim 5, wherein the substrate comprises an engineered Silicon On Insulator (SOI) wafer.

11. The MEMS device of claim 5, wherein the substrate is formed from a cap wafer.

12. The MEMS device of claim 1, further comprising at least one feature within one of the first enclosure or the second enclosure to limit motion of one of the first or second structures.

13. The MEMS device of claim 12, wherein the at least one feature comprises a MEMS stop.

14. The device of claim 1, wherein the MEMS device comprises an inertial sensor.

* * * * *